(12) United States Patent
Cho (10) Patent No.: US 7,790,552 B2
(45) Date of Patent: Sep. 7, 2010

(54) METHOD FOR FABRICATING SEMICONDUCTOR DEVICE WITH BULB-SHAPED RECESS GATE

(75) Inventor: Sang-Hoon Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 294 days.

(21) Appl. No.: 11/803,059

(22) Filed: May 11, 2007

(65) Prior Publication Data

US 2008/0132051 A1  Jun. 5, 2008

(30) Foreign Application Priority Data

Dec. 5, 2006  (KR) ................ 10-2006-0122021

(51) Int. Cl.
*H01L 21/336* (2006.01)
(52) U.S. Cl. .............. 438/272; 257/330; 257/E21.588
(58) Field of Classification Search ......... 438/270–272; 257/330, E21.588
See application file for complete search history.

(56) References Cited

U.S. PATENT DOCUMENTS 6,010,930 A * 1/2000 Keller et al. ............... 438/238

| | | | |
|---|---|---|---|
| 7,262,460 B2 * | 8/2007 | Schmitz et al. | 257/330 |
| 2001/0023960 A1 | 9/2001 | Soga et al. | |
| 2006/0049455 A1 | 3/2006 | Jang et al. | |
| 2006/0289931 A1 * | 12/2006 | Kim et al. | 257/330 |
| 2007/0254430 A1 * | 11/2007 | Cheng | 438/243 |

FOREIGN PATENT DOCUMENTS

| | | |
|---|---|---|
| CN | 1649111 | 8/2005 |
| JP | 11-40817 | 2/1999 |
| JP | 2001-53083 | 2/2001 |
| KR | 10-2007-0030022 | 3/2007 |

* cited by examiner

*Primary Examiner*—Kiesha R Bryant
*Assistant Examiner*—Mark W Tornow
(74) *Attorney, Agent, or Firm*—Blakely, Sokoloff, Taylor & Zafman (57) ABSTRACT

A method for fabricating a semiconductor device includes forming a plurality of bulb-shaped recesses in a substrate, forming a gate insulation layer over the substrate including the bulb-shaped recesses, forming a patterned first conductive layer over sidewalls of a bulb pattern of the corresponding bulb-shaped recesses, and forming a patterned second conductive layer over the gate insulation layer while filling the bulb-shaped recesses.

18 Claims, 7 Drawing Sheets

METHOD FOR FABRICATING SEMICONDUCTOR DEVICE WITH BULB-SHAPED RECESS GATE

CROSS-REFERENCE TO RELATED APPLICATIONS

The present invention claims priority of Korean patent application number 10-2006-0122021, filed on Dec. 5, 2006, which is incorporated by reference in its entirety.

BACKGROUND OF THE INVENTION

The present invention relates to a method for fabricating a semiconductor device, and more particularly, to a method for fabricating a semiconductor device having a bulb-shaped recess gate.

Recently, as the integration scale of semiconductor device has been increased, a bulb-shaped recess gate structure that can increase a channel length of a cell transistor has received a great attention from many researchers. Hereinafter, with reference to FIGS. 1A to 1D, a method for fabricating a semiconductor device having such a bulb-shaped recess gate will be briefly explained.

Figure 1A:
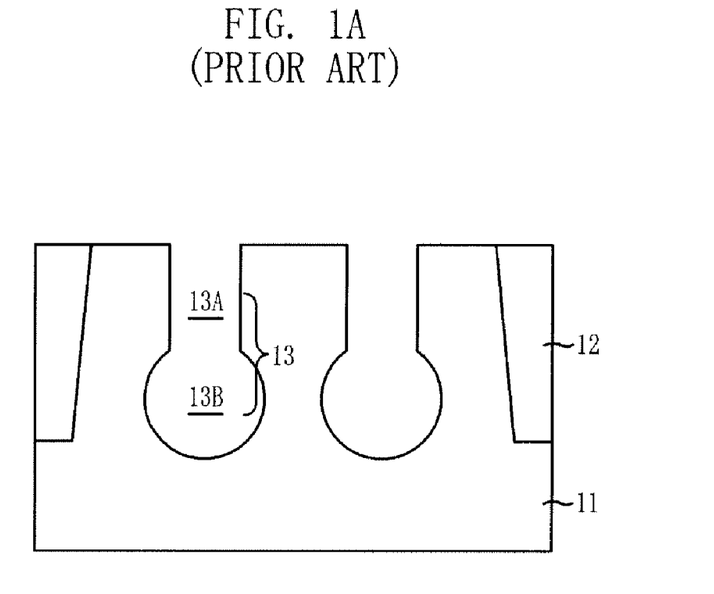
FIGS. 1A to 1D illustrate a typical method for fabricating a semiconductor device.

FIGS. 1A to 1D illustrate a typical method for fabricating a semiconductor device. As shown in FIG. 1A, a device isolation structure 12 is formed in a substrate 11 to define an active region.

A plurality of bulb-shaped recesses 13 are formed in the active region of the substrate 11. In more detail, certain portions of the active region of the substrate 11 are etched to form a neck pattern 13A having a vertical profile. A spacer insulation layer (not shown) is formed over sidewalls of the neck pattern 13A. Then, the substrate 11 below the neck pattern 13A is subjected to an isotropic etching process using the spacer insulation layer as a barrier to form a bulb pattern 13B having a sphere profile. The bulb-shaped recesses 13 are formed with the neck pattern 13A and the bulb pattern 13B via the etching process performed by two steps.

Figure 1B:
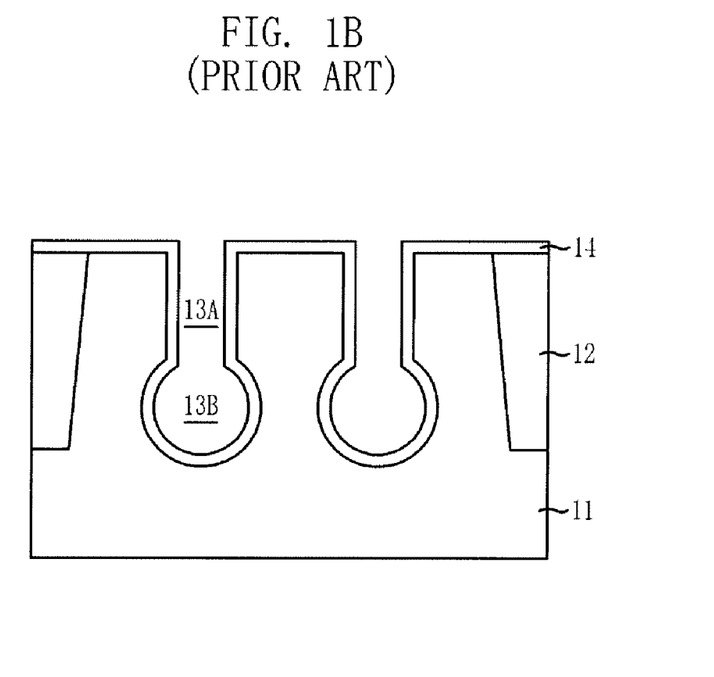

As shown in FIG. 1B, a gate insulation layer 14 is formed over an entire surface of the device isolation structure 12 and the bulb-shaped recesses 13.

Figure 1C:
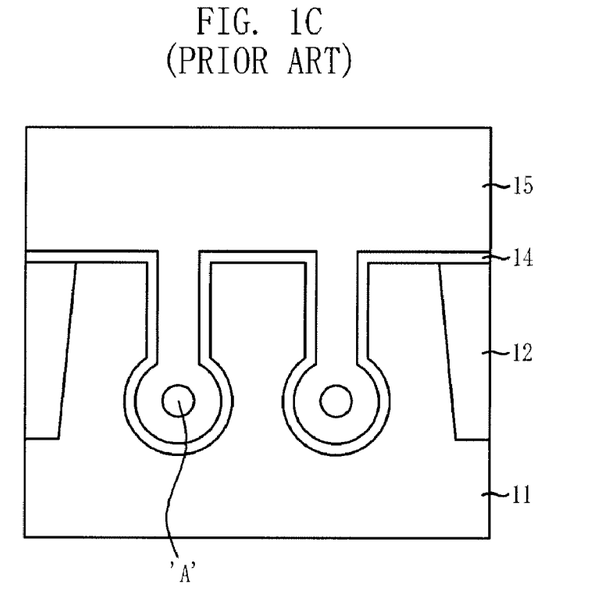

As shown in FIG. 1C, a polysilicon layer 15 for gate electrodes is formed over the gate insulation layer 14. The polysilicon layer 15 includes a conductive layer. Since a width of the neck pattern 13A formed at an upper portion of the corresponding recesses 13 is narrower than that of the bulb pattern 13B formed at a lower portion of the corresponding recesses 13, the polysilicon layer 15 first fills the neck pattern 13A before the polysilicon layer 15 completely fills the bulb pattern 13B. As a result, a polysilicon seam identified with a reference letter 'A' is generated inside the bulb-pattern 13B. This polysilicon seam 'A' shifts to the inside of the bulb pattern 13B through a subsequent thermal process. Particularly, the polysilicon seam 'A' shifts to the direction which a surface energy is decreasing so that it exists at a boundary portion between the bulb pattern 13B and the gate insulation layer 14. The polysilicon seam 'A' existing at the boundary portion between the bulb pattern 13B and the gate insulation layer 14 induces a potential drop phenomenon or generates a mis-operation of a transistor due to a deformation of a seam distribution.

Figure 1D:
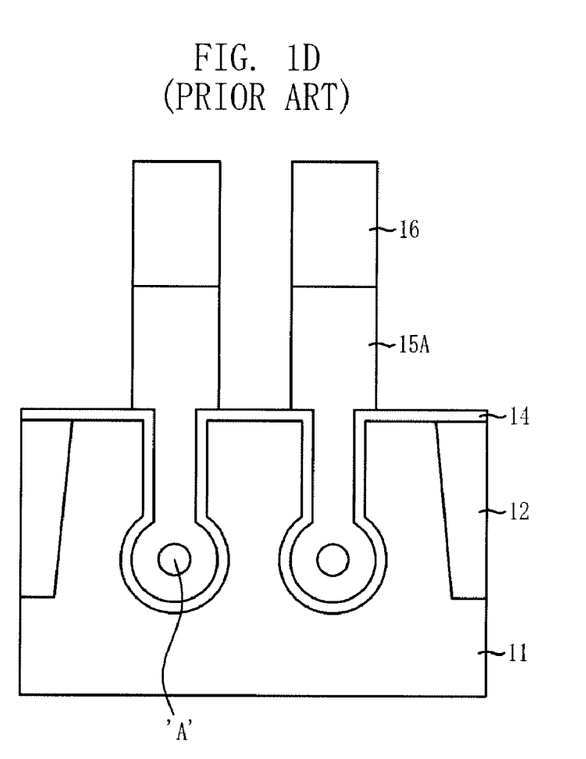

As shown in FIG. 1D, a gate hard mask layer is formed over the polysilicon layer 15 having the seam 'A' and then, the gate hard mask layer and the polysilicon layer 15 are selectively etched. Accordingly, a gate hard mask pattern 16 and a patterned polysilicon layer 15A forms a gate pattern. A metal layer or a metal silicide layer (not shown) may be disposed between the patterned polysilicon layer 15A and the gate hard mask pattern 16.

Figure 2A:
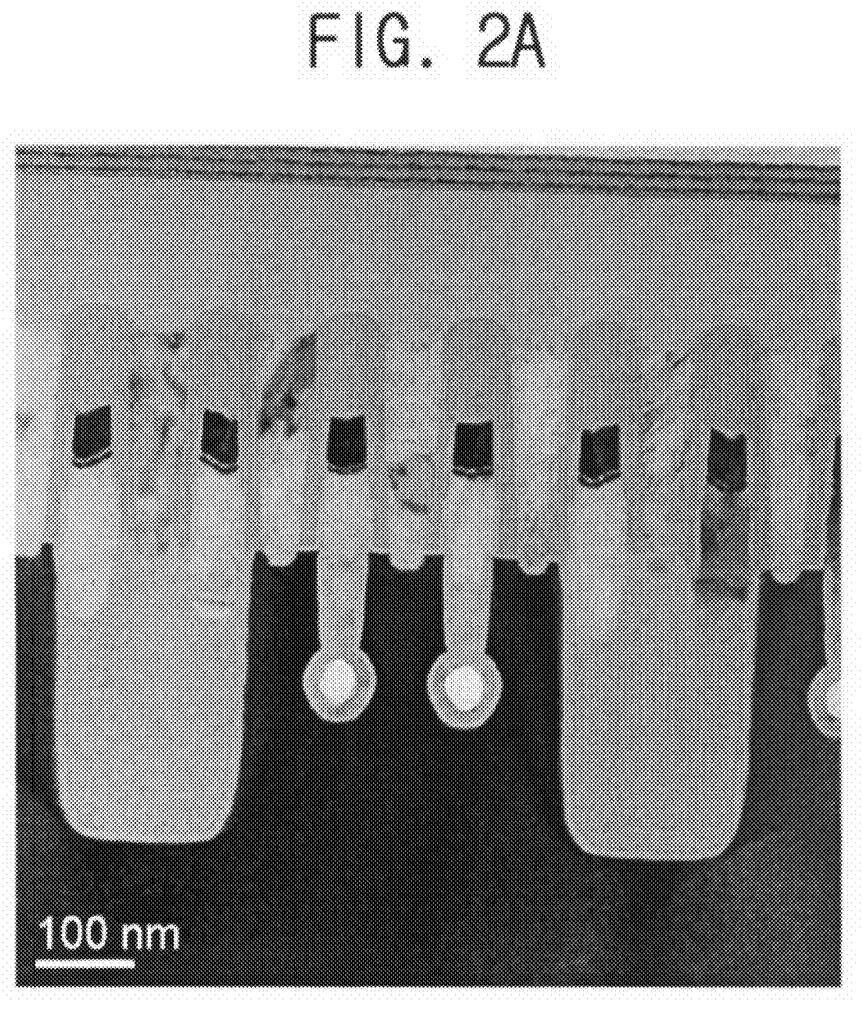
FIGS. 2A and 2B illustrate a generation and a shift of a polysilicon seam at a typical semiconductor device.
Figure 2B:
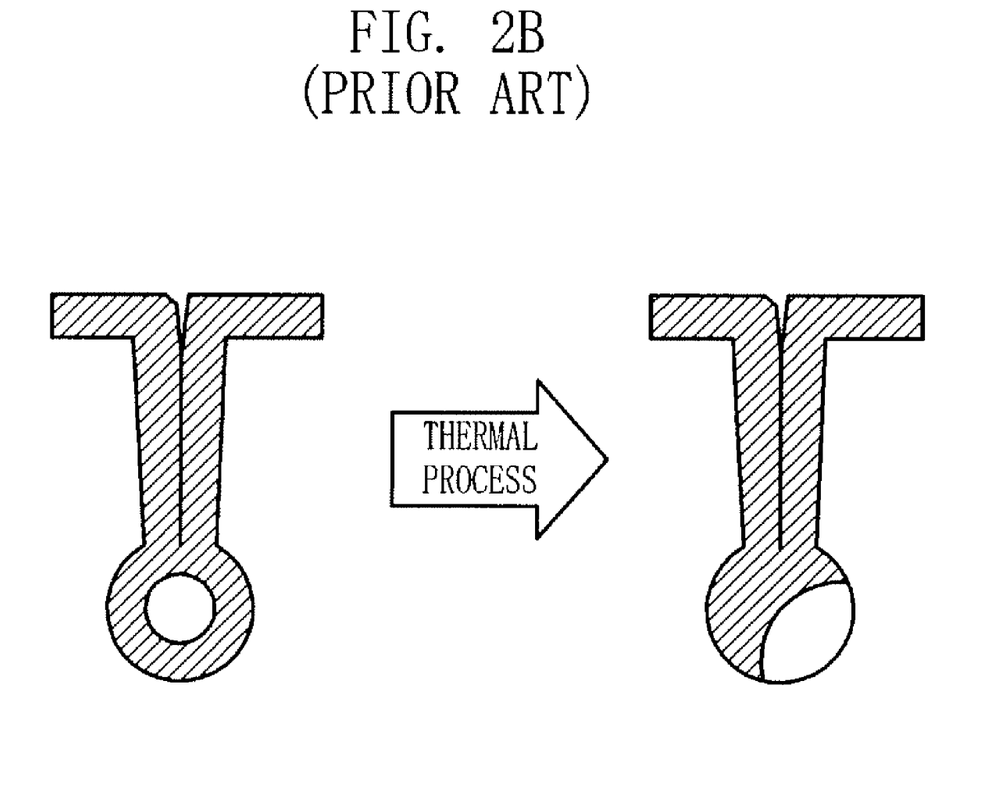

FIGS. 2A and 2B illustrate a generation and a shift of a polysilicon seam at a typical semiconductor device. As shown in FIG. 2A, a polysilicon layer is not uniformly formed inside a bulb-shaped recess but a seam that is not filled with the polysilicon layer is generated inside the bulb pattern of a bulb-shaped recess. The reason for the generation of the seam is that a width of a neck pattern of the bulb-shaped recess is narrower than that of the bulb pattern of the bulb-shaped recess.

As shown in FIG. 2B, the seam shifts to the inside of the bulb pattern through a subsequent thermal process and particularly, shifts to an inner wall of the bulb pattern. Various distributions of the shift of the seam are also possible.

For the typical bulb-shaped recess gate fabrication process, in the case of forming a polysilicon layer over a bulb-shaped recess to form a gate electrode, a seam is generated inside a bulb pattern due to the structure property of the bulb-shaped recess. The seam shifts via a subsequent thermal process and thus, various seam distributions may be shown. Accordingly, the seam affects a device property such as mis-operation of a transistor.

SUMMARY OF THE INVENTION

Embodiments of the present invention are directed toward providing a method for fabricating a semiconductor device having a bulb-shaped recess gate capable of reducing a generation of a seam inside the bulb-shaped recess and improving a device property.

In accordance with one aspect of the present invention, there is provided a method for fabricating a semiconductor device. The method includes forming a plurality of bulb-shaped recesses in a substrate, forming a gate insulation layer over the substrate including the bulb-shaped recesses, forming a patterned first conductive layer over sidewalls of a bulb pattern of the corresponding bulb-shaped recesses, and forming a patterned second conductive layer over the gate insulation layer while filling the bulb-shaped recesses.

In accordance with another aspect of the present invention, there is provided a method for fabricating a semiconductor device. The method includes forming a plurality of bulb-shaped recesses in a substrate, forming a gate insulation layer over the substrate and the bulb-shaped recesses, forming a first conductive layer over the gate insulation layer, performing an etch back process on the first conductive layer until the gate insulation layer is exposed, forming a second conductive layer over the first conductive layer and the exposed gate insulation layer, forming a gate hard mask pattern over the second polysilicon layer, and etching the second polysilicon layer to obtain a patterned second polysilicon layer.

DESCRIPTION OF SPECIFIC EMBODIMENTS

Figure 3A:
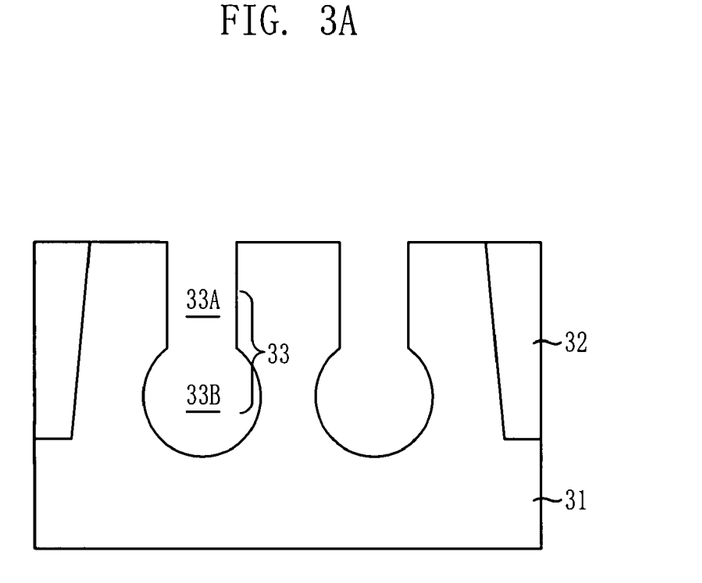
FIGS. 3A to 3F illustrate a method for fabricating a semiconductor device in accordance with an embodiment of the present invention.

FIGS. 3A to 3F illustrate a method for fabricating a semiconductor device in accordance with an embodiment of the present invention. As shown in FIG. 3A, a device isolation structure 32 is formed in a substrate 31 to define an active region. The device isolation structure 32 can be formed via a shallow trench isolation (STI) process.

A plurality of bulb-shaped recesses 33 are formed in the substrate 31. In more detail, certain portions of the active region of the substrate 31 are etched to form a neck pattern 33A having a vertical profile. An insulation layer (not shown) for spacers is formed over sidewalls of the neck pattern 33A. Then, the substrate 31 below the neck pattern 33A is subjected to an isotropic etching process using the insulation layer as a barrier to form a bulb pattern 33B having a sphere profile. Each of the bulb-shaped recesses 33 includes the neck pattern 33A and the bulb pattern 33B.

Figure 3B:
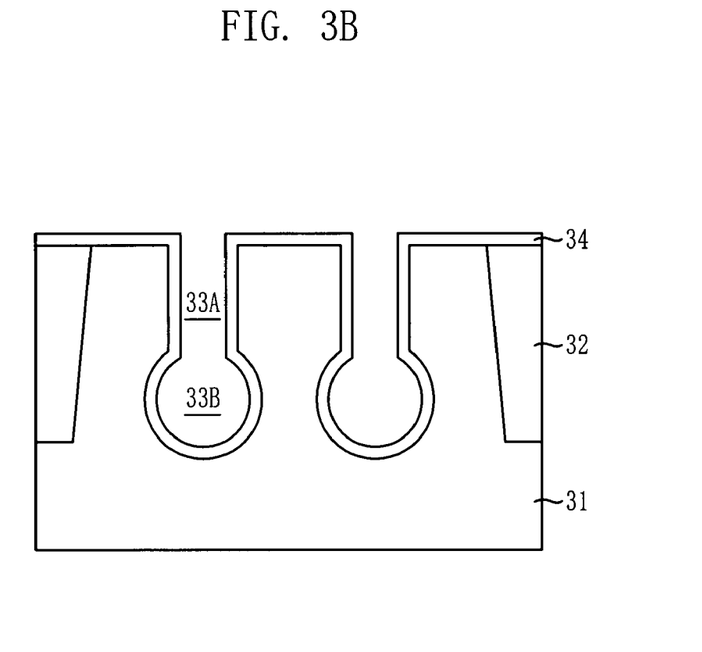

As shown in FIG. 3B, a gate insulation layer 34 is formed over an entire surface of the substrate 31 including the bulb-shaped recesses 33. The gate insulation layer 34 includes an oxide-based layer.

Figure 3C:
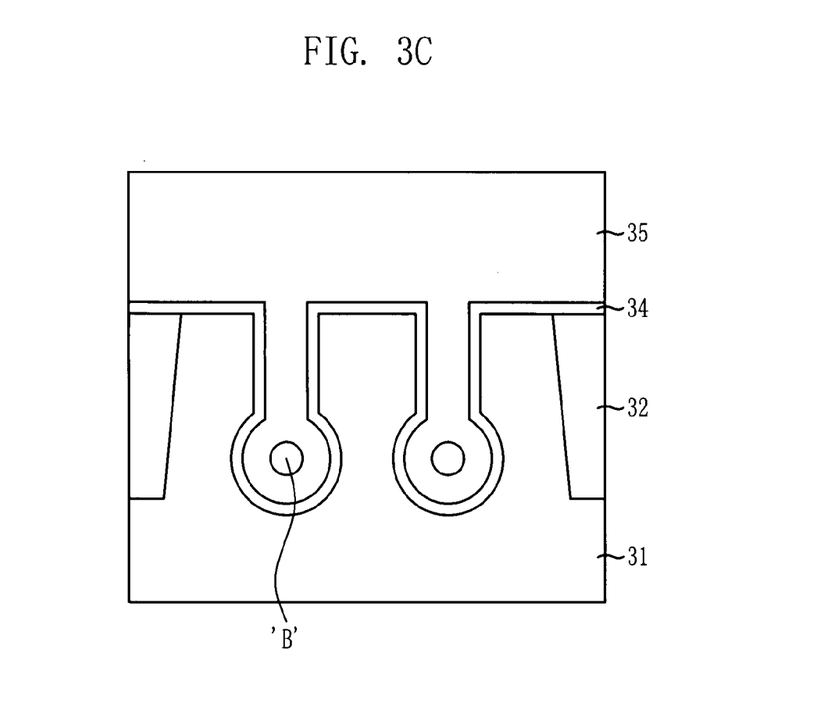

As shown in FIG. 3C, a first conductive layer 35 is formed over the gate insulation layer 34 to form gate electrodes. The first conductive layer 35 includes a polysilicon-based material. Due to a property of the bulb-shaped recesses 33 having the neck pattern 33A of which a width is narrower than that of the bulb pattern 33B, a seam 'B' which is not completely filled with the first conductive layer 35 is generated inside the bulb pattern 33B. The first conductive layer 35 can be formed using a single type deposition apparatus.

Figure 3D:
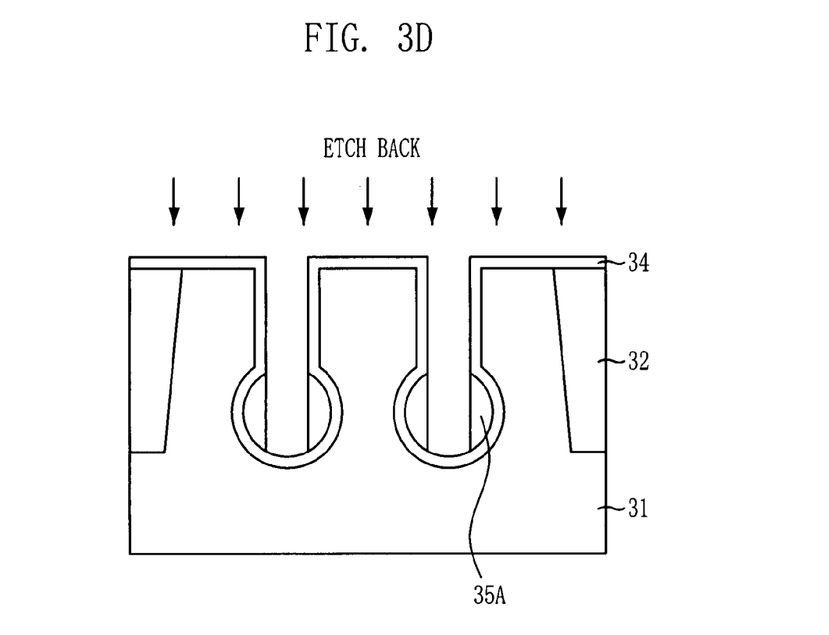

As shown in FIG. 3D, an etch back process is performed on the first conductive layer 35 until the gate insulation layer 34 is exposed. As a result, the first conductive layer 35 exists only over sidewalls of the bulb pattern 33B. The first conductive layer existing over the sidewalls of the bulb pattern 33B is identified with a reference numeral 35A. Accordingly, profiles of the bulb-shaped recesses 33 are changed nearly into vertical profiles and thus, in the case of forming a conductive layer such as a polysilicon layer as a subsequent process, a seam is not generated. The etch back process performed on the first conductive layer 35 includes using a mixture gas including hydrogen bromide (HBr), chlorine ($Cl_2$), and oxygen ($O_2$), a pressure ranging from about 10 mTorr to about 70 mTorr and a bias power ranging from about 100 W to about 400 W.

Figure 3E:
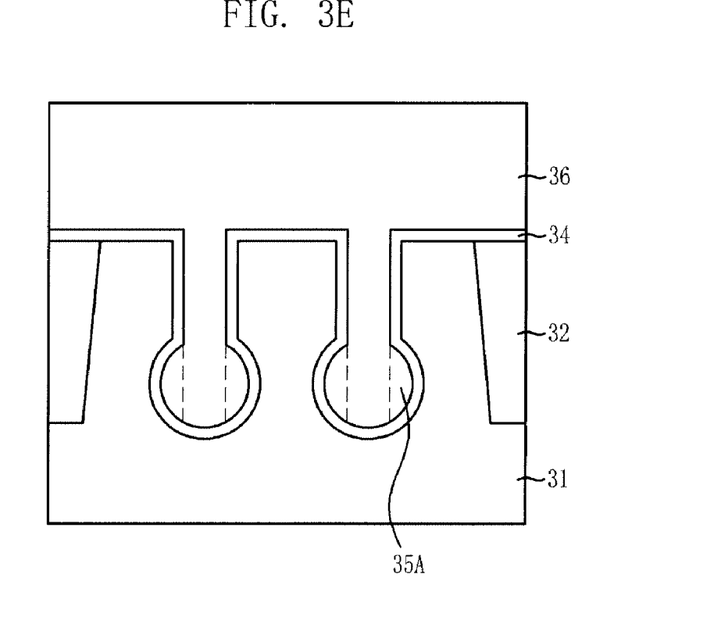

As shown in FIG. 3E, a second conductive layer 36 for gate electrodes is formed over the resultant structure including the exposed gate insulation layer 34. The second conductive layer 36 includes a polysilicon-based material layer (not shown). As described above, since the profiles of the bulb-shaped recesses 33 changed to the vertical profiles due to the etch back process, the second conductive layer 36 can be formed inside the bulb-shaped recesses 33 without forming the seam. The second conductive layer 36 can be formed using a furnace type deposition apparatus.

Figure 3F:
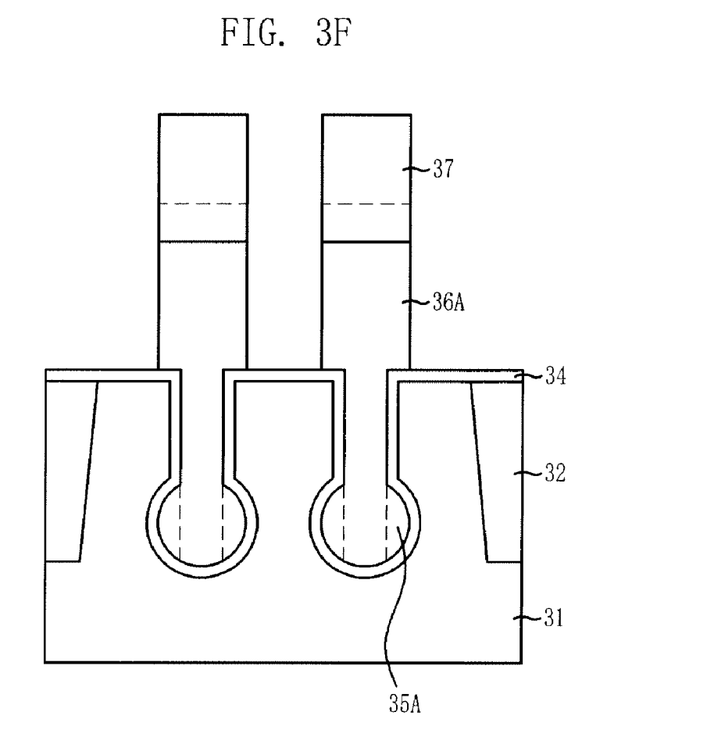

As shown in FIG. 3F, a gate hard mask layer (not shown) is formed over the second conductive layer 36. The gate hard mask layer and the second conductive layer 36 are selectively etched to obtain a gate hard mask pattern 37 and a patterned second conductive layer 36A. As a result, a gate pattern is formed with the gate hard mask pattern 37 and the patterned second conductive layer 36A. A metal layer or a metal silicide layer (shown as dashed lines) may be disposed between the patterned second conductive layer 36A and the gate hard mask pattern 37.

According to this embodiment of the present invention, in the case of forming a conductive layer inside a bulb-shaped recess, the conductive layer is formed via two steps. As a result, a seam is not generated inside the bulb-shaped recess, thereby improving a device property.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a plurality of bulb-shaped recesses in a substrate;
    forming a gate insulation layer over the substrate including the bulb-shaped recesses;
    forming a first conductive layer over the gate insulation layer;
    patterning the first conductive layer to remove a seam generated inside the bulb-shaped recesses during the forming of the first conductive layer, wherein the first conductive layer remains over only sidewalls of the bulb-shaped recesses, the profile of the bulb-shaped recesses being changed into vertical profiles; and
    forming a patterned second conductive layer over the gate insulation layer while filling the bulb-shaped recesses, wherein the patterned second conductive layer directly contacts the gate insulation layer at the bottom of the bulb-shaped recesses.

2. The method of claim 1, wherein patterning the first conductive layer includes:
    performing an etch back process on the first conductive layer until the gate insulation layer is exposed.

3. The method of claim 1, wherein the patterned first and second conductive layers each include a polysilicon-based material.

4. The method of claim 2, wherein the performing of the etch back process on the first conductive layer includes using a mixture gas including hydrogen bromide, chlorine and oxygen.

5. The method of claim 4, wherein the performing of the etch back process on the first conductive layer includes using a pressure ranging from about 10 mTorr to about 70 mTorr, and a bias power ranging from about 100 W to about 400 W.

6. The method of claim 3, wherein the forming of the patterned first conductive layer includes using a single type deposition apparatus.

7. The method of claim 3, wherein the forming of the patterned second conductive layer includes using a furnace type deposition apparatus.

8. A method for fabricating a semiconductor device, the method comprising:
    forming a plurality of bulb-shaped recesses in a substrate;
    forming a gate insulation layer over the substrate including the bulb-shaped recesses;
    forming a first conductive layer over the gate insulation layer;
    performing an etch back process on the first conductive layer until the gate insulation layer is exposed to remove a seam generated inside the bulb-shaped recesses during the forming of the first conductive layer, wherein the first conductive layer remains over only sidewalls of the bulb-shaped recesses, the profile of the bulb-shaped recesses being changed into vertical profiles;
    forming a second conductive layer over the first conductive layer and the exposed gate insulation layer, wherein the second conductive layer directly contacts the gate insulation layer at the bottom of the bulb-shaped recesses,
    forming a gate hard mask pattern over the second conductive layer; and
    etching the second conductive layer to obtain a patterned second conductive layer.

9. The method of claim 8, wherein the forming of the bulb-shaped recesses in the substrate comprises:

etching predetermined portions of an active region of the substrate to form a neck pattern having a vertical profile; and forming an insulation layer for spacers over sidewalls of the neck pattern.

10. The method of claim 9, further comprising isotropically etching the substrate below the neck pattern using the insulation layer as a barrier to form a bulb pattern having a spherical profile, wherein the bulb-shaped recesses include the neck pattern and the bulb pattern.

11. The method of claim 8, wherein the gate insulation layer includes an oxide-based layer.

12. The method of claim 8, wherein the first conductive layer and the second conductive layer form gate electrodes.

13. The method of claim 8, wherein the first conductive layer and the second conductive layer include a polysilicon-based material.

14. The method of claim 8, wherein the forming of the first conductive layer comprises using a single type deposition apparatus.

15. The method of claim 8, wherein the performing of the etch back process on the first conductive layer comprises using a mixture gas including hydrogen bromide, chlorine, and oxygen, a pressure ranging from about 10 mTorr to about 70 mTorr, and a bias power ranging from about 100 W to about 400 W.

16. The method of claim 8, wherein the forming of the second conductive layer comprises using a furnace type deposition apparatus.

17. The method of claim 8, wherein the gate hard mask pattern and the patterned second conductive layer form a gate pattern.

18. The method of claim 8, further comprising forming one of a metal layer and a metal silicide layer between the patterned second conductive layer and the gate hard mask pattern.

* * * * *